United States Patent
De Maaijer

(10) Patent No.: US 8,942,760 B2
(45) Date of Patent: Jan. 27, 2015

(54) INTEGRATED BLUETOOTH AND WIRELESS LAN TRANSCEIVERS HAVING MERGED LOW NOISE AND POWER AMPLIFIER

(75) Inventor: Luc De Maaijer, Belfeld (NL)

(73) Assignee: ST-Ericsson SA, Plan-les-Ouates (CH)

( * ) Notice: Subject to any disclaimer, the term of this patent is extended or adjusted under 35 U.S.C. 154(b) by 279 days.

(21) Appl. No.: 13/081,863

(22) Filed: Apr. 7, 2011

(65) Prior Publication Data

US 2012/0032741 A1 Feb. 9, 2012

Related U.S. Application Data

(60) Provisional application No. 61/370,895, filed on Aug. 5, 2010.

(51) Int. Cl.
| | |
|---|---|
| H04M 1/00 | (2006.01) |
| H04B 1/40 | (2006.01) |
| H03F 3/45 | (2006.01) |
| H03F 3/16 | (2006.01) |
| H03F 3/195 | (2006.01) |
| H03F 3/21 | (2006.01) |
| H03F 3/24 | (2006.01) |

(52) U.S. Cl.
CPC ............... *H04B 1/406* (2013.01); *H03F 3/195* (2013.01); *H03F 3/211* (2013.01); *H03F 3/245* (2013.01); *H03F 3/45183* (2013.01); *H03F 2200/06* (2013.01); *H03F 2200/09* (2013.01)
USPC ............ 455/550.1; 455/77; 330/253; 330/277

(58) Field of Classification Search
CPC ............ H04B 1/401; H04B 1/44; H04B 1/48; H03F 3/195; H03F 3/211
USPC ............... 455/73, 77, 78, 83, 550.1; 330/250, 330/253, 264, 269, 277
See application file for complete search history.

(56) References Cited

U.S. PATENT DOCUMENTS

| | | | |
|---|---|---|---|
| 2002/0055376 A1* | 5/2002 | Norimatsu | 455/575 |
| 2006/0071712 A1* | 4/2006 | Lee | 330/254 |
| 2010/0027568 A1 | 2/2010 | Rajendran et al. | |
| 2010/0156532 A1* | 6/2010 | Wang et al. | 330/253 |
| 2010/0203847 A1* | 8/2010 | Gorbachov | 455/84 |
| 2010/0237945 A1* | 9/2010 | Cassia et al. | 330/277 |
| 2012/0013387 A1* | 1/2012 | Sankaranarayanan et al. | 327/355 |

OTHER PUBLICATIONS

Chang-Tsung Fu, et al., "A 2.5GHz 32nm 0.35mm2 3.5dB NF -5dB P1bB Fully Differential CMOS Push-Pull LNA with Integrated 34dBm T/R Switch and ESD Protection" "97/-1-61284-302-5/11", copyrighted 2011, IEEE.

(Continued)

*Primary Examiner* — Andrew Wendell
(74) *Attorney, Agent, or Firm* — Patent Portfolio Builders PLLC

(57) ABSTRACT

A group of transistors operate as a combined power amplifier, to amplify signals to be transmitted, and as a low noise amplifier, to amplify signals which are received. In a first mode, the group of transistors is configured to amplify the signals to be transmitted by turning all of the transistors in both a first subset and a second subset on. In a second mode, the group of transistors is configured to amplify the signals which have been received by turning on the first subset of transistors and turning off the second subset of transistors.

20 Claims, 7 Drawing Sheets

(56) References Cited

OTHER PUBLICATIONS

Chang-Tsung Fu, et al., Abstract, "A 2.5GHz 32nm 0.35mm2 3.5dB NF -5dB P1bB Fully Differential CMOS Push-Pull LNA with Integrated 34dBm T/R Switch and ESD Protection" "97/-1-61284-302-5/11", Solid-State Circuits Conference Digest of Technical Papers (ISSCC), 2011 IEEE International, Issue Date: Feb. 20-24, 2011, pp. 56-58.

Knopik, Vincent et al., "018 um Thin Oxide CMOS Transceiver Front-End with Integrated Tx/Rx Commutator for Low Cost Bluetooth Solutions," ESSCIRC '03 Conference on Sep. 16-18, 2003, Piscataway, NJ, USA, IEEE, pp. 675-678., ISBN: 0-7803-8108-4; XP010678580, 2003.

\* cited by examiner

INTEGRATED BLUETOOTH AND WIRELESS LAN TRANSCEIVERS HAVING MERGED LOW NOISE AND POWER AMPLIFIER

RELATED APPLICATION

This application is related to, and claims priority from, U.S. Provisional Patent Application No. 61/370,895, entitled "Integrated Bluetooth and Wireless LAN Transceivers", filed on Aug. 5, 2010, the disclosure of which is incorporated here by reference.

TECHNICAL FIELD

The present invention relates generally to communications systems, devices and methods and, in particular, to systems where transmissions and receptions are combined with a switch to connect to one antenna port or filter.

BACKGROUND

As technology advances, the options for communications have become more varied. For example, in the last 30 years in the telecommunications industry, personal communications have evolved from a home having a single rotary dial telephone, to a home having multiple telephone, cable and/or fiber optic lines that accommodate both voice and data. Additionally cellular phones and wireless networking technologies have added a mobile element to communications. In terms of wireless networking communications, two of the currently dominant, standardized approaches are specified in the Wireless LAN (WLAN, "Wi-Fi", 802.11a/b/g/n) standard and the Bluetooth standard.

WLAN devices are frequently used, for example, to provide wireless Internet connectivity and operate in two frequency bands, i.e., a low band disposed in the 2.4 GHz Industrial, Scientific and Medical Band (ISM band) and a high band disposed in the 5 GHz range. Bluetooth devices also operate in the 2.4 GHz band and are frequently used, for example, for short range wireless communications, e.g., between a mobile phone and an associated earbud device.

SUMMARY

According to an exemplary embodiment, a combined power amplifier and low noise amplifier includes a plurality of transistors connected to one another and configured to operate in a first mode as a power amplifier for a signal to be transmitted by said device, and further configured to operate in a second mode as a low noise amplifier for a signal which has been received by the device, the plurality of transistors including a first subset of transistors and a second subset of transistors, wherein in the first mode the first subset of transistors and the second subset of transistors are configured to be turned on to operate together as the power amplifier, wherein in the second mode the first subset of the plurality of transistors are configured to be turned on to operate as the low noise amplifier and the second subset of the plurality of transistors are configured to be turned off.

According to another exemplary embodiment, a method for amplifying received signals and signals to be transmitted in a combined power amplifier and low noise amplifier device includes the steps of providing a plurality of transistors connected to one another, the plurality of transistors including a first subset of transistors and a second subset of transistors, amplifying the signals to be transmitted by configuring the plurality of transistors to operate in a first mode as a power amplifier, wherein in the first mode the first subset of transistors and the second subset of transistors are configured to be turned on to operate together as the power amplifier, amplifying the received signals by configuring the plurality of transistors to operate in a second mode as a low noise amplifier, wherein in the second mode the first subset of the plurality of transistors are configured to be turned on to operate as the low noise amplifier and the second subset of the plurality of transistors are configured to be turned off.

BRIEF DESCRIPTION OF THE DRAWINGS

The accompanying drawings illustrate exemplary embodiments, wherein.

ACRONYM LIST

ADC Analog-To-Digital Converter
BT Bluetooth
DAC Digital-To-Analog Converter
HB High Band
LB Low Band
LNA Low Noise Amplifier
LO Local Oscillator
PA Power Amplifier
RF Radio Frequency
SOC System On Chip
WLAN Wireless Local Area Network

DETAILED DESCRIPTION

The following detailed description of the exemplary embodiments refers to the accompanying drawings. The same reference numbers in different drawings identify the same or similar elements. Also, the following detailed description does not limit the invention. Instead, the scope of the invention is defined by the appended claims.

Figure 1:
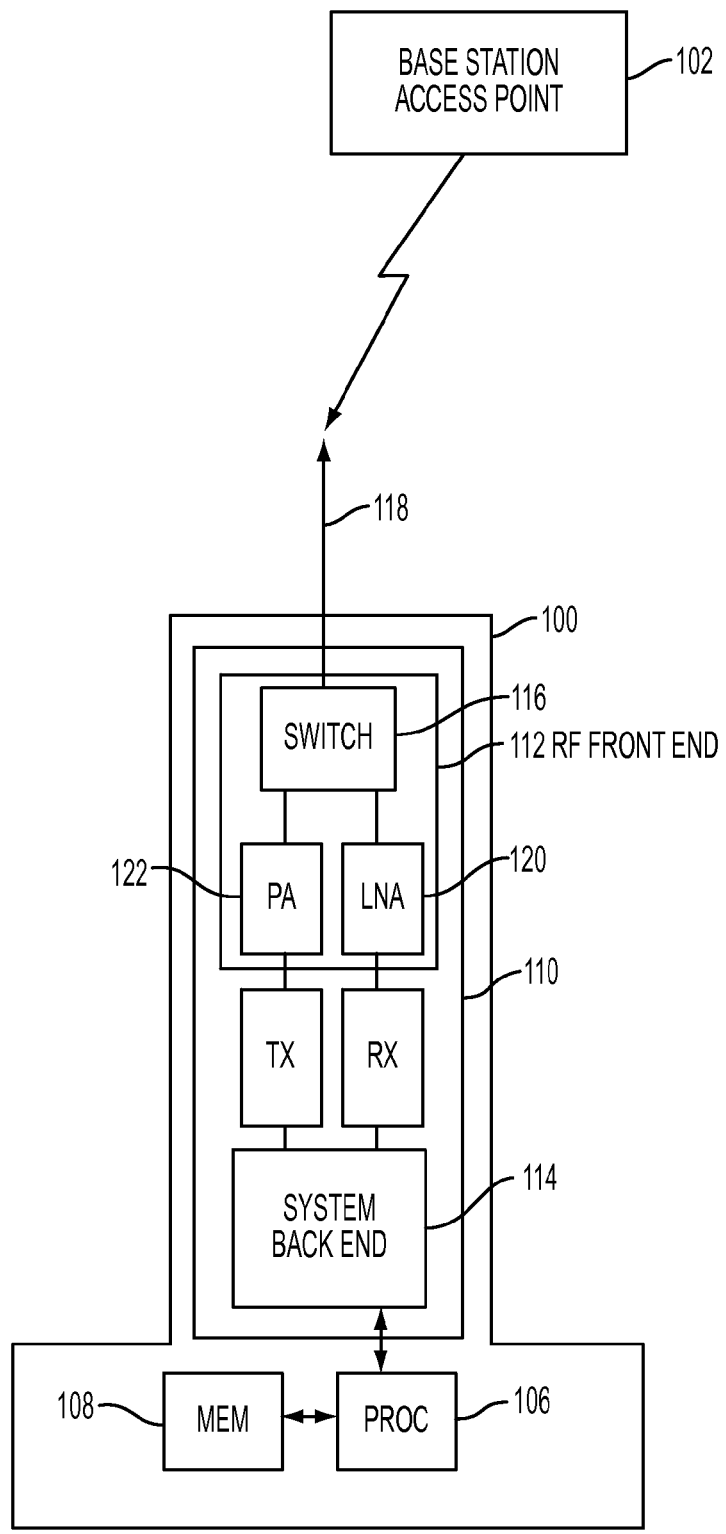
FIG. 1 illustrates a communication system according to an exemplary embodiment.

In order to provide some context for this discussion, FIG. 1 illustrates an exemplary electronic device 100 which is capable of communicating with, for example, a WiMax/Wibro base station, an WLAN access point or other transmitting and receiving part of a network represented by 102. The exemplary electronic device 100 includes a processor 106 which is connected to a memory device 108, and which controls a transceiver 110. The transceiver 110 can be characterized as including an RF front end 112 and a back end 114.

As will be described in more detail below, the RF front end 112 is generally responsible, for example, for tasks such as switching RX and TX via switch 116 to the antenna port associated with antenna 118, up and down converting the signals, filtering and amplification of signals which have been received (via low noise amplifier (LNA) 120) or are to be transmitted (via power amplifier (PA) 122) by electronic device 100. The back end 114 is generally responsible, for example, for tasks such as modulation/demodulation and coding/decoding of signals to be transmitted or which have been received, respectively. The RF front end 112 and back end 114 may be integrated into a system on chip (SOC) or multiple integrated circuits (IC). The RF front end 112 is connected to one or more antennas 118 via the switch 116 to combine the transmit and receive signals. However, embodiments described below can omit the switch 116 by combining the PA 122 and LNA 120 into one set of transistors which are directly connected to the antenna 118.

Figure 2:
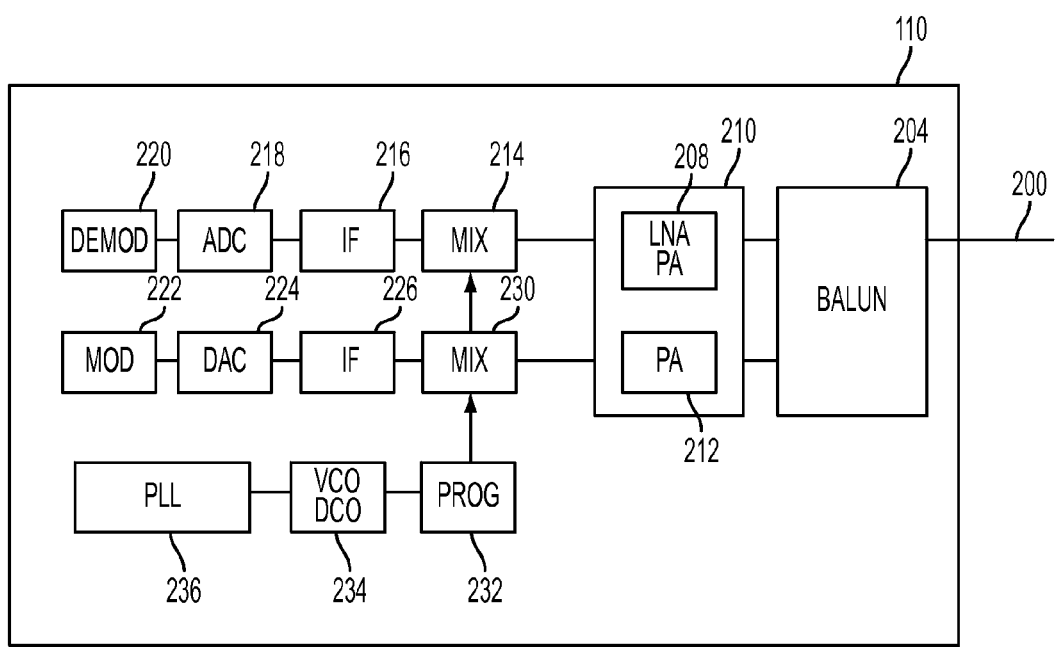
FIG. 2 illustrates an exemplary transceiver on a chip according to an exemplary embodiment.

FIG. 2 depicts a transceiver 110 according to an exemplary embodiment in more detail, wherein the transceiver 110 is capable of transmitting and receiving different types of signals, e.g., BT signals, WLAN signals, and/or WiMAX signals. It can be seen in FIG. 2 that the RF front end 112 and system back end 114 are integrated into a single chip. One significant feature of the exemplary transceiver illustrated in FIG. 2 is that the pin 200 is used to convey signals from and toward the antenna 118, without the switch as depicted in FIG. 1. Among other things, combining reception and transmission to a single pin 200 advantageously reduces the pin count of the transceiver 110 and eliminates the need for an external switch between transmission and reception and the antenna 118. Features which enable this reduction in pin count associated with signals to be coupled to the antenna 118 will be described in more detail below with respect to FIG. 3.

To briefly describe the general operation of the blocks shown in FIG. 2, and generally moving from the right to the left of FIG. 2, a signal received by electronic device 100 is conveyed by pin 200 to balun 204. From the balun 204, the received signal travels to a low noise amplifier (LNA) 208 which amplifies the received signal. As denoted by box 210, the LNA 208 is combined with the power amplifier (PA) 212 which amplifies the signals being transmitted by the transceiver 110 in a manner which will be described below with respect to FIGS. 3(a) and 3(b).

Continuing on the receive path, the amplified, received signal next reaches mixer 214 which downconverts (mixes) the amplified received signal to produce an intermediate frequency (IF), which IF signal is then filtered at block 216. The IF is converted from an analog signal to a digital signal by analog-to-digital converter (ADC) 218, and then demodulated by demodulator 220 to generate an output signal to the processor 106 (not shown in FIG. 2).

Moving down to the transmit portion of transceiver 110 and generally moving from the left to the right of the Figure, data which is received from the processor 106 for transmission is modulated by modulator 222, converted from digital to analog by DAC 224 to produce an IF signal that then is filtered in block 226. After filtering, the signal is frequency upconverted by mixer block 230 and amplified via the power amplifier PA 212. A phase-locked loop (PLL) 236, digitally controlled oscillator (DCO) or voltage controlled oscillator (VCO) 234 and programmable frequency divider 232 provide input frequencies to the ADC 218, DAC 224 and mixers 214 and 230 for downconversion and upconversion, respectively.

Figure 3A:
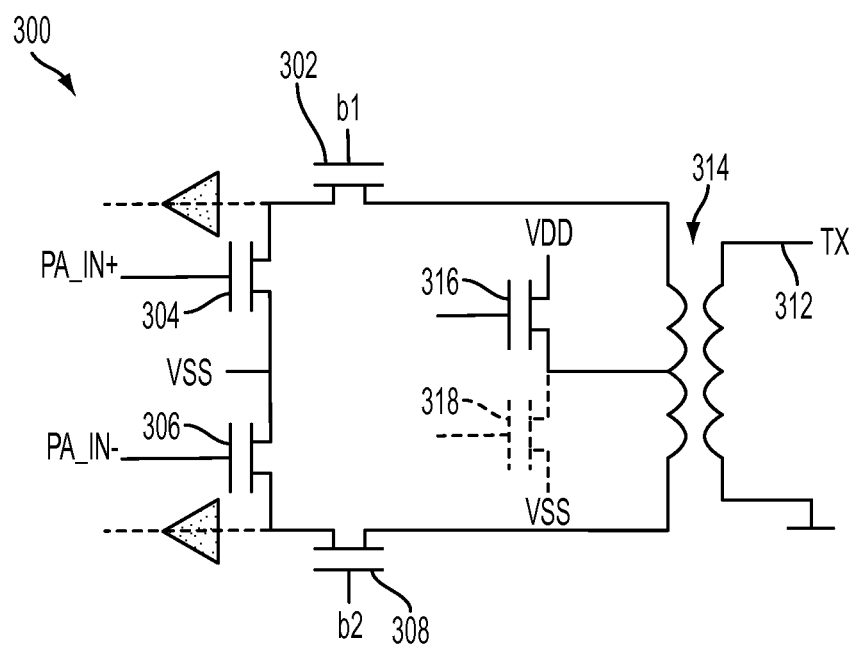
FIGS. 3(a) and 3(b) depict a merged low noise amplifier (LNA) and power amplifier (PA) according to an exemplary embodiment.

In conventional implementations, an LNA and a PA are typically implemented separately since, for example, receive and transmit chains are implemented separately from one another. However, according to exemplary embodiments, the LNAs 208 can be merged together with the PAs 212. Among other potential advantages, this merger of LNAs and PAs offers the benefit of requiring a smaller area on the chip to implement these elements. A first example of a merged LNA/PA 300, which can be used in transceivers (e.g., a BT, WLAN, WiMAX/WiBRO transceiver), is shown in FIG. 3(a), in transmit mode, and FIG. 3(b), in receive mode. Note that in these two Figures, elements, e.g., transistors and signal lines, which are shown in dotted lines are turned off or inactive during that particular mode of operation.

Starting with FIG. 3(a), during transmit mode of the transceiver 110, all four of the transistors 302, 304, 306 and 308 are on and operate together as a power amplifier 212 to amplify a transmit signal received on the gate lines (PA_In+ and PA_In−) of transistors 304 and 306, respectively. Note transistors 304 and 306 for those skilled in the art are also called common source (CS) transistors and may also be built out of a multitude of transistors that together form an amplifier. The amplified signal is coupled to the joint RX/TX pin 312 by balun 314. During transmit mode, the transistors 302 and 308 have a fixed potential applied to their gates (e.g., 2.2V) and the voltage VDD (a relatively high voltage) is applied to the center tap of the balun 314, by turning transistor 316 on and transistor 318 off, so that maximum power efficiency of the amplification circuitry is achieved. More specifically, during transmit mode, transistor 302 operates as a cascode (CG) for the power amplifier.

Figure 3B:
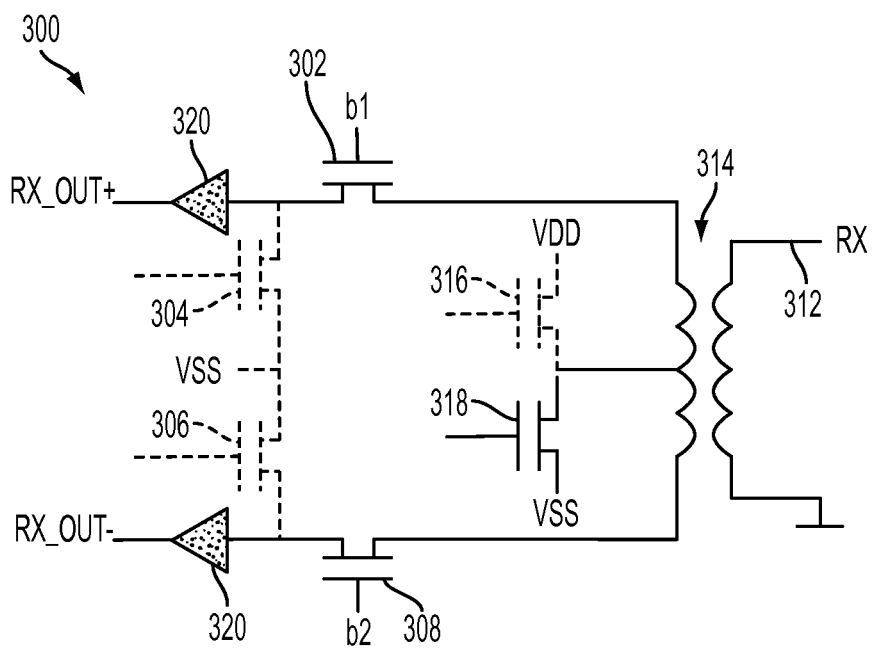

During receive mode, as shown in FIG. 3(b), circuitry 300 operates as an LNA for a signal received via pin 312. To enter this mode of operation, transistors 304 and 306 are switched off by placing a relatively low potential on their gate lines. Then, transistors 302 and 308 operate to amplify the received signal from pin 312 via balun 314, i.e., operating as the LNA. At this time, the voltage VSS applied to the center tap of the balun 314 is reduced to a relatively low potential, e.g., by switching off transistor 316 and turning on transistor 318, to enable transistors 302 and 308 to operate as a common gate (CG) LNA by switching their polarity. The drain side (high potential) of transistors 302 and 308 are connected to amplifying stages that amplify the received signal prior to being forwarded to, e.g., a mixer 214 for downconverting.

Figure 4:
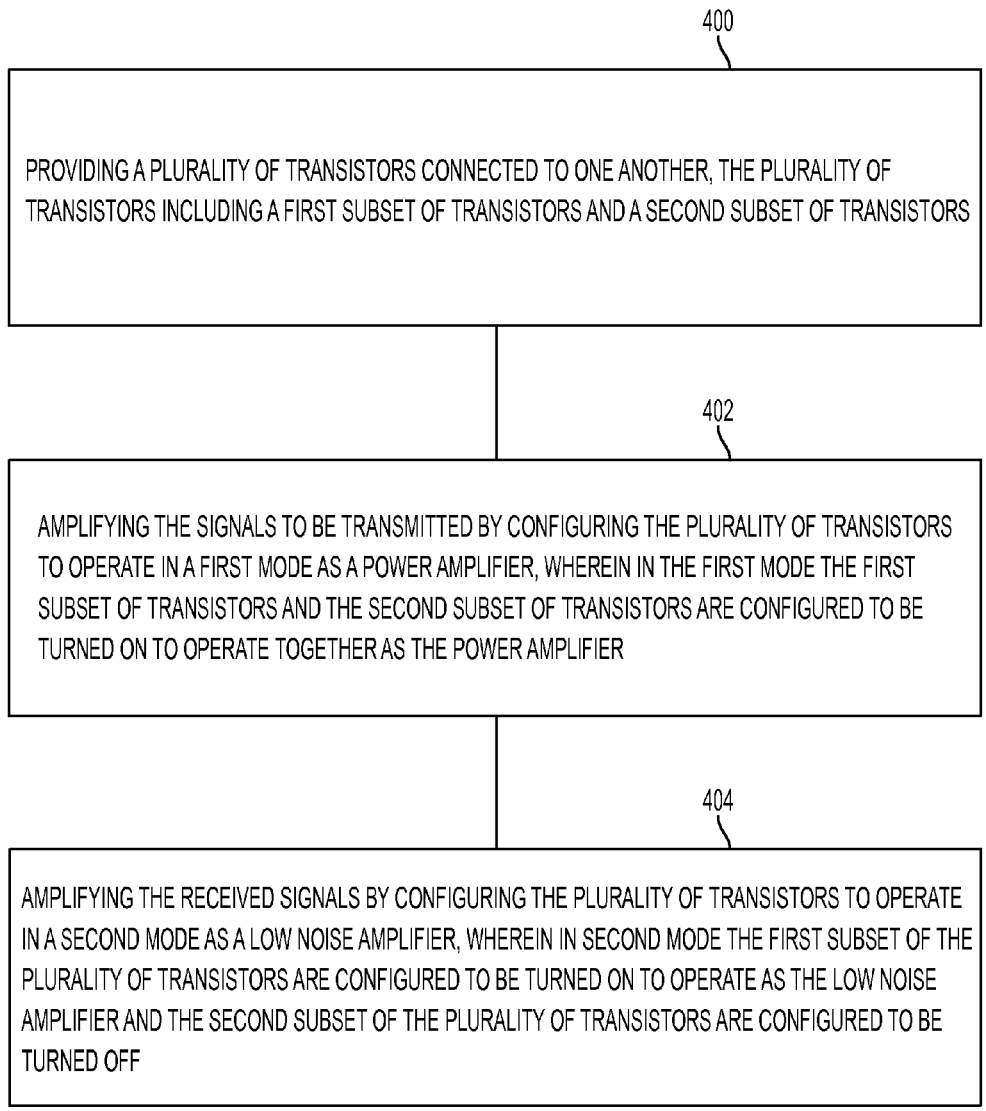
FIG. 4 is a flowchart depicting a method of amplifying signals using a combined power amplifier and low noise amplifier according to an exemplary embodiment.

Thus, according to one exemplary embodiment, a method for amplifying received signals and signals to be transmitted in a combined power amplifier and low noise amplifier device, can include the steps illustrated in the flow chart of FIG. 4. Therein, at step 400, a plurality of transistors connected to one another are provided, the plurality of transistors including a first subset of transistors and a second subset of transistors. Signals to be transmitted are amplified, at step 402, by configuring the plurality of transistors to operate in a first mode as a power amplifier, wherein in the first mode the first subset of transistors and the second subset of transistors are configured to be turned on to operate together as the power amplifier. Received signals are amplified, at step 404, by configuring the plurality of transistors to operate in a second mode as a low noise amplifier, wherein in the second mode the first subset of the plurality of transistors are configured to be turned on to operate as the low noise amplifier and the second subset of the plurality of transistors are configured to be turned off.

Figure 5:
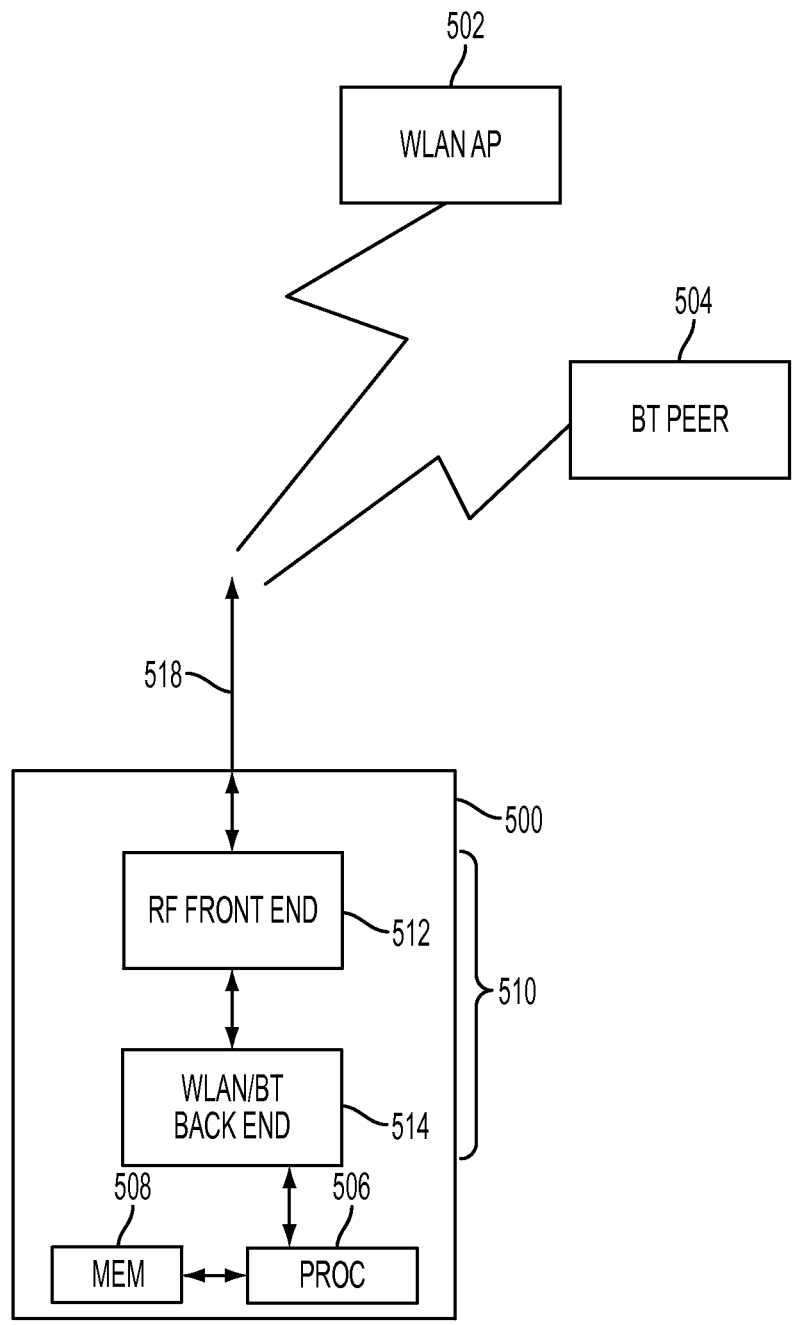
FIG. 5 illustrates a multi-standard communication system according to another embodiment.

Embodiments, as described above, can be applied to transceivers 110 which operate in accordance with the transmission and reception of signals according to a single standard. However other embodiments can be applied to transceivers which operate to provide multi-mode or multi-standard transmit and receive capability, e.g., Bluetooth (BT) and wireless LAN (WLAN) transceivers an example of which is shown in FIG. 5.

Therein, an exemplary electronic device 500 is capable of communicating with both WLAN devices, e.g., represented by WLAN access point (AP) 502, and BT devices, e.g., represented by BT peer 504. The exemplary electronic device 500 includes a processor 506 which is connected to a memory device 508, and which controls a combined WLAN/BT transceiver 510. The WLAN/BT transceiver 510 can be characterized as including an RF front end 512 and a WLAN/BT back end 514 (the latter of which is sometimes also referred to as a system-on-chip (SOC)), and can contain sets of elements which are similar to those shown in FIG. 2, e.g., one set for the WLAN portion and one set for the BT portion.

The merged LNA/PA embodiments described above can also be applied to the multi-mode or multi-standard transceiver 510. For example, two LNAs (one each for BT and WLAN) can be used and two PAs (one each for BT and WLAN) can be provided within transceiver 510. According to one embodiment, the BT LNA and the BT PA can be merged together as described above, while the WLAN LNA and WLAN PA can remain unmerged. According to another embodiment, the BT LNA and BT PA can remain unmerged, while the WLAN LNA and WLAN PA are merged together in accordance with the earlier described techniques. According to a third embodiment, both the BT LNA and BT PA can be merged and the WLAN LNA and WLAN PA can be merged.

Figure 6:
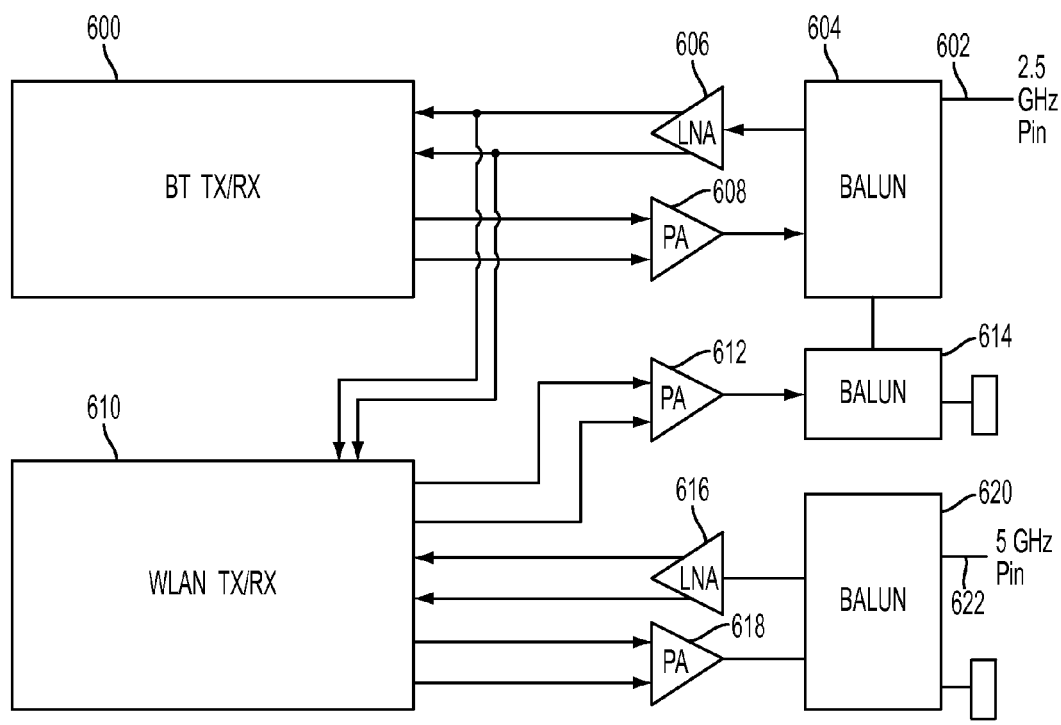
FIG. 6 depicts a multi-standard transceiver which share a pin according to an embodiment.

According to another embodiment, the number of pins used to transmit/receive signals in a BT/WLAN multi-mode transceiver 510 can be reduced to two pins, i.e., a low band pin and a high band pin, by enabling a low-band portion of the WLAN transmit/receive chain share the same pin as the BT transmit/receive chain, as generally illustrated in FIG. 6. Therein, BT TX/RX chain 600 receives BT signals via pin 602 through balun 604 and LNA 606, and transmits BT signals via pin 602 through PA 608 and balun 604. The low-band WLAN portion of WLAN TX/RX shares the pin 602 by receiving low-band WLAN signals via balun 604 and LNA 606, and transmitting low-band WLAN signals via PA 612 and balun 614, which couples such low-band WLAN signals onto pin 602. High-band WLAN operations can be performed using LNA 616, PA 618, balun 620 and high-band pin 622.

Figure 7:
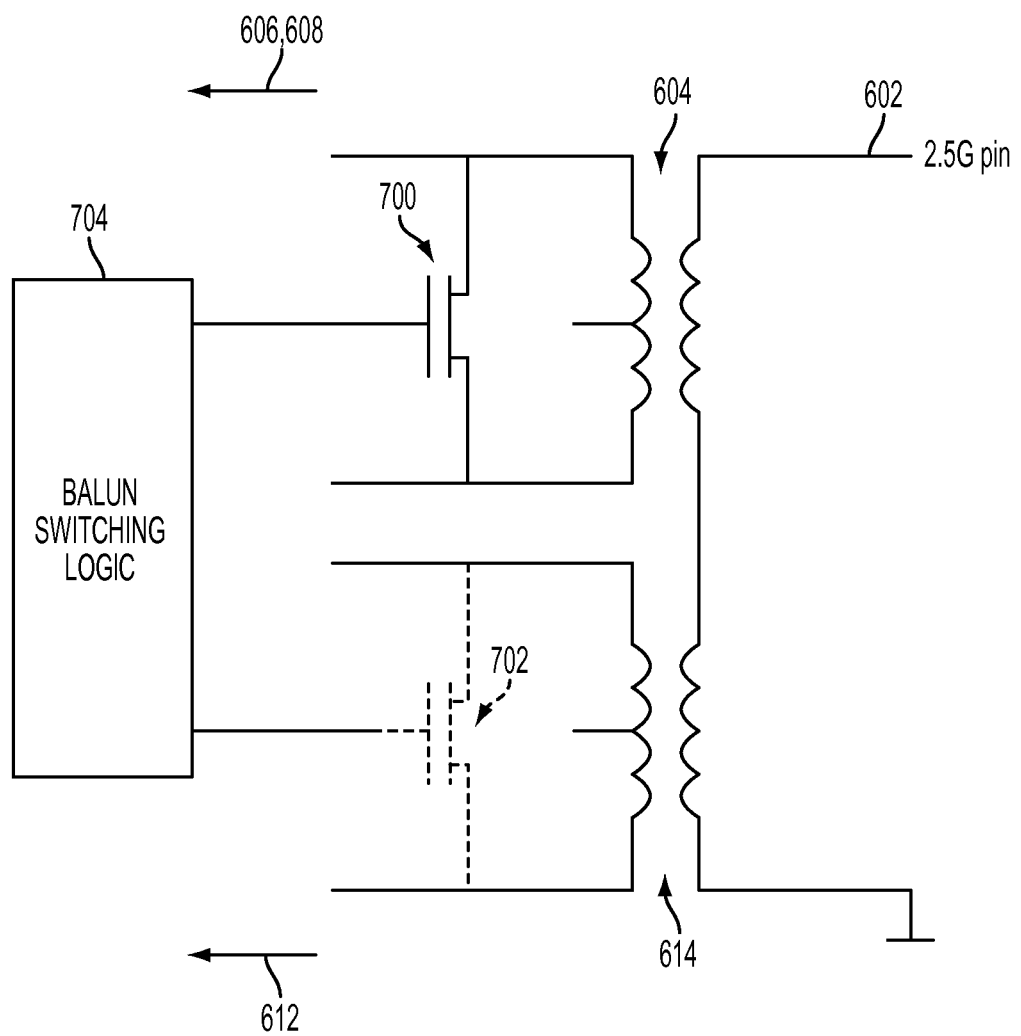
FIG. 7 illustrates a balun-switching architecture associated with the embodiment of FIG. 6.

To share pin 602 according to this embodiment, balun switching logic can be implemented in transceiver 510 as, for example, illustrated in FIG. 7. Therein balun 604 is connected in series on its primary side to balun 614. On the secondary side, balun 604 is connected to the BT amplifiers 606, 608 and the balun 614 is connected to the WLAN LB PA amplifier 612. Additionally, each balun 604, 614 has a transistor 700, 702, respectively, which operate as switches to selectively short circuit the secondary side of either balun 604 or 614 under the control of balun switching logic 704.

Balun switching logic may be provided from any desired hardware or software element within transceiver 110 via a control signal to turn on or off the transistor 700 or 702. In the example of FIG. 7, transistor 700 is turned on, thereby short circuiting the secondary of balun 604, while transistor 702 is turned off (as indicated by the dotted lines), thereby enabling balun 614 to couple a WLAN LB signal arriving from PA 612 onto the pin 602. Alternatively, when a BT signal is to be transmitted by electronic device 100, balun 604 can be connected to pin 602 by turning on transistor 702 and turning off transistor 700.

Although described in this latter embodiment with respect to WLAN and BT, the present invention is not limited to those two standards and is instead applicable to communications associated with other standards, for example WLAN, WiBRO/WIMAX or other communication standards.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

The invention claimed is:

1. A combined power amplifier and low noise amplifier device comprising:
a plurality of transistors connected to one another and configured to operate in a first mode as a power amplifier for a first signal to be transmitted by said device, and further configured to operate in a second mode as a low noise amplifier for a second signal, which has been received by said device,
said plurality of transistors including a first subset of transistors and a second subset of transistors,
wherein in said first mode said first subset of transistors and said second subset of transistors are configured to be turned on to operate together to amplify said first signal, while said first subset of transistors conduct said first signal in a first direction, a transistor among said first subset of transistors operating as a cascode, and
wherein in said second mode said first subset of transistors are configured to be turned on with a low-noise attenuation polarity opposite to a power-amplifier polarity that said first subset of transistors has during said first mode, to operate as said low noise amplifier while said second subset of transistors are configured to be turned off, said first subset of transistors conducting said second signal in a second direction opposite to said first direction.

2. The combined power amplifier and low noise amplifier device of claim 1 wherein, when configured to operate in said first mode, said signal to be transmitted is received over gate lines of said second subset of transistors.

3. The combined power amplifier and low noise amplifier device of claim 1, wherein each transistor in said second subset is connected to a voltage source.

4. The combined power amplifier and low noise amplifier device of claim 1 wherein, when configured to operate in said second mode, said signal which has been received is passed to a receive signal line connected to said first subset of transistors.

5. The combined power amplifier and low noise amplifier device of claim 4, wherein said receive signal line includes an amplifier to amplify said signal which has been received.

6. The combined power amplifier and low noise amplifier device of claim 1, wherein said device is implemented as an integrated circuit.

7. The combined power amplifier and low noise amplifier device of claim 6, wherein said device is further configured to receive and to transmit multi-standard signals.

8. The combined power amplifier and low noise amplifier device of claim 6, wherein said device is further configured to receive Bluetooth (BT) and low band Wireless Local Area Network (WLAN) signals and to transmit BT signals and low band WLAN signals via a single pin of said integrated circuit and further wherein said device is configured to operate in said first mode to amplify both BT signals and low band WLAN signals to be transmitted via said single pin and in said second mode to amplify both received BT signals and received WLAN signals which are input to said plurality of transistors from said single pin.

9. The combined power amplifier and low noise amplifier device of claim 8, wherein said single pin is connected to a first balun and a second balun, and further comprising:
- a first switch configured to short circuit said first balun when said low band WLAN signals are to be transmitted; and
- a second switch configured to short circuit said second balun when said BT signals are to be transmitted.

10. A method for amplifying received signals and signals to be transmitted in a combined power amplifier and low noise amplifier device, the method comprising:
- providing a plurality of transistors connected to one another, said plurality of transistors including a first subset of transistors and a second subset of transistors;
- amplifying said first signals to be transmitted by configuring said plurality of transistors to operate in a first mode as a power amplifier, wherein in said first mode said first subset of transistors and said second subset of transistors are configured to be turned on to operate together to amplify said first signals, while said first subset of transistors conduct said first signals in a first direction, a transistor among said first subset of transistors operating as a cascode; and
- amplifying said received signals by configuring said plurality of transistors to operate in a second mode as a low noise amplifier, wherein in said second mode said first subset of transistors are configured to be turned on with a low-noise attenuation polarity opposite to a power-amplifier polarity that said first subset of transistors has during said first mode, to operate as said low noise amplifier while said second subset of transistors are configured to be turned off, said first subset of transistors conducting said received signals in a second direction opposite to said first direction.

11. The method of claim 10, further comprising:
receiving, when configured to operate in said first mode, said signals to be transmitted over gate lines of said second subset of transistors.

12. The method of claim 10, wherein each transistor in said second subset is connected to a voltage source.

13. The method of claim 10, further comprising:
passing, when configured to operate in said second mode, said amplified, received signals to a receive signal line connected to said first subset of transistors.

14. The method of claim 13, further comprising:
inverting said amplified received signals on said receive signal line.

15. The method of claim 10, wherein said combined power amplifier and low noise amplifier device is implemented as an integrated circuit.

16. The method of claim 15, further comprising:
configuring said combined power amplifier and low noise amplifier device to receive Bluetooth (BT) and low band Wireless Local Area Network (WLAN) signals and to transmit BT signals and low band WLAN signals.

17. The method of claim 15, further comprising:
configuring said combined power amplifier and low noise amplifier device to receive Bluetooth (BT) and low band Wireless Local Area Network (WLAN) signals and to transmit BT signals and low band WLAN signals via a single pin of said integrated circuit;
wherein said device is configured to operate in said first mode to amplify both BT signals and low band WLAN signals to be transmitted via said single pin and in said second mode to amplify both received BT signals and received WLAN signals which are input to said plurality of transistors from said single pin.

18. The method of claim 17, wherein said single pin is connected to a first balun and a second balun, and further comprising:
short circuiting said first balun when said low band WLAN signals are to be transmitted; and
short circuiting said second balun when said BT signals are to be transmitted.

19. A combined power amplifier (PA) and low noise amplifier (LNA) device, comprising:
- a first pair of transistors arranged in a common source mode configuration to receive and amplify equal but opposite polarity transmission signals when said device is in a transmit PA mode of operation; and
- a third and fourth transistor, a respective one of each arranged in a cascode configuration with a respective one of said first pair of transistors when said device is in said transmit PA mode of operation to facilitate amplifying said transmission signals, wherein said third and fourth transistors conduct said transmission signals in a first direction, and
- when said device is in said LNA receive mode, said first pair of transistors are switched off, and said third and fourth transistors operate as a common gate LNA to amplify a received signal by conducting said received signals in a second direction opposite to said first direction.

20. The combined PA and LNA device according to claim 19, wherein
said device is implemented as an integrated circuit.

* * * * *